US005619039A

United States Patent [19]
Montanari

[11] Patent Number: 5,619,039
[45] Date of Patent: Apr. 8, 1997

[54] DEVICE FOR THE DETECTION OF ELECTROMAGNETIC WAVES AND, IN PARTICULAR, OF INFRARED RADIATION

[75] Inventor: Jean-Louis Montanari, Herbeys, France

[73] Assignee: Societe Francaise de Detecteurs Infra-Rouges - Sofradir, France

[21] Appl. No.: 573,394

[22] Filed: Dec. 15, 1995

[30] Foreign Application Priority Data

Jan. 20, 1995 [FR] France .................................. 95 00861

[51] Int. Cl.$^6$ ...................................................... G01J 5/02
[52] U.S. Cl. ........................................................ 250/352
[58] Field of Search ............................................. 250/352

[56] References Cited

U.S. PATENT DOCUMENTS 5,103,097  4/1992  Montanari .............................. 250/352
5,146,303  9/1992  Kornrumpf .

FOREIGN PATENT DOCUMENTS

| 0395487 | 10/1990 | European Pat. Off. . |
| 0419371 | 3/1991 | European Pat. Off. . |
| 0571907 | 12/1991 | European Pat. Off. . |
| 0485312 | 5/1992 | European Pat. Off. . |
| 2629912 | 10/1989 | France . |

Primary Examiner—Carolyn E. Fields
Attorney, Agent, or Firm—Harris Beach & Wilcox, LLP

[57] ABSTRACT

A device is provided for the detection of infrared radiation which operates at low temperature. The device contains a detection unit and a cryostat equipped with a cold finger to exchange heat with a cold source. Included is a cold plane having at least one machined portion, each portion having a recess toward the center of the cold plane in the region of a through-slot opening outside the cold finger. A connection element is positioned by insertion into each recess, and is electrically connected to the connector of the cryostat.

3 Claims, 3 Drawing Sheets

DEVICE FOR THE DETECTION OF ELECTROMAGNETIC WAVES AND, IN PARTICULAR, OF INFRARED RADIATION

BACKGROUND OF THE INVENTION

The invention relates to an electromagnetic wave detector and, more particularly, an infrared radiation detector.

As is known, infrared detectors most often operate at low temperature, that is to say typically at temperatures of between 50 and 200 Kelvin. In fact, the detector device proper is generally associated with a cryostatic chamber (cryostat) which makes it possible, depending on the working temperature of the detector, to cool the latter by means of a cold finger supplied either with liquid helium or liquid air or liquid nitrogen, or else by a cryogenic source device.

The technical field of the invention will be discussed below with reference to FIG. 1 which represents an infrared detector of the prior art.

Heat exchange between the detector proper and the cryostat generally takes place via a cold finger (1) in direct contact with the cryogenic source, the end of this cold finger being hermetically sealed and having a cold plane (2) fixed in contact with it, which cold plane generally consists of a metal or ceramic part fixed to the cold finger by bonding or soldering.

In some cases, the cold plane (2) itself seals the cold finger (1). This cold plane is intended to accommodate the detection unit, that is to say the assembly consisting, on the one hand, of at least one electronic circuit (4) for detecting electromagnetic waves, which converts in known fashion electromagnetic radiation into an electrical signal and is associated with a read circuit (3) capable of converting the electrical signals output by the detection circuit (4), in particular by amplifying them to make them suitable for subsequent processing. The cold plane (2) additionally transfers heat between the cold finger (1) of the cryostat and said detection unit.

In most infrared detectors currently used, the detection circuit (4) is hybridized with the read circuit (3), for example by means of indium microbumps. Similarly, there may be a plurality of detection circuits on the same read circuit. In other applications, moreover, it is also possible to provide a plurality of read circuits and a plurality of detection circuits which are interconnected by hybridization via an electrical interconnection network underlying said detection and read circuits, the interconnection network including metallized contacts or tracks for providing electrical conduction between said circuits.

In most cases, the detection unit (3, 4) is mechanically fixed to a connection circuit (7) constituting a structure called the focal assembly, the connection circuit itself being constituted by a plate of an insulating material having, on its upper surface, that is to say the surface intended to come into contact with the detection unit, metal tracks and contacts (5) which also make it possible to solder the microwires (6). This connection circuit (7) has the function of transferring the electrical signals from the read circuit (3) to the internal connection system proper of the cryostat, which system is itself connected to a connector consisting, in known fashion, of a part making it possible to transfer the electrical signals out of the cryostat, while sealing off the internal part of the latter from the outside. There are many well-known techniques for fabricating these connectors, and these are described, for example, in documents DE-A-3,344,713 and U.S. Pat. No. 3,259,865.

In view of the interconnection method, in particular between the detection unit (3, 4) or the focal assembly (3, 4, 7) and the connector, a cryostat whose geometry depends directly on the geometry of the component which constitutes it, is associated with each type of detector.

More specifically, the connector of the cryostat, the function of which is to transfer the electrical signals out of the cryostat without breaking the seal of the latter, and additionally making it possible to analyze the electrical signals outside the cryostat, in particular by means of pins, has dimensions and a configuration (number and positioning of the pins, etc.) which are directly linked with those of the detector. In fact, producing specific connectors for each of the detector types employed gives rise to a significant cost increase and nonnegligible time losses.

It has therefore been deemed desirable to standardize, and in any case to regularize, the dimensions of the connector independently of the geometry of the detector employed, and therefore to standardize the connector/cryostat electrical interfaces. In other words, for a fixed connector geometry, it is desired to make it possible to associate all types of constituent component of the detection unit or of the focal assembly, of variable dimensions and, in particular, detectors with large dimensions, and additionally to make it possible to produce the electrical connections between the detector and the connector easily.

Connecting the detection unit (3, 4) or the focal assembly (3, 4, 7) to the internal connection system of the cryostat often requires the use of flexible lines such as electrical conductors which are difficult to use and have the critical drawback of giving rise to vacuum degassing phenomena which are significant and are therefore capable of detrimentally affecting the working life without maintenance. In addition, such flexible lines have, after they are fitted, offsets which are also significant and can hinder the fixing of a heat and/or optical screen whose function may prove essential in the context of optimizing the measurements and detections made with such a device.

SUMMARY OF THE INVENTION

The object of the invention is therefore to provide a device for the detection of electromagnetic radiation and, in particular, infrared radiation which can overcome these drawbacks and, in particular, to provide, for a fixed connector geometry and configuration, particularly a defined interpin spacing and diameter, a component of variable dimensions and, in particular, large dimensions which might even be greater than the actual dimensions of the connector.

In this device for the detection of electromagnetic waves and, in particular, of infrared radiation, which operates at low temperature and comprises:

a cryostat equipped with a cold finger intended to exchange heat with a cold source;

a cold plane arranged generally perpendicularly relative to the cold finger and mechanically fixed to and in heat exchange with the latter;

a detection unit comprising at least one detection circuit proper, sensitive to the electromagnetic radiation to be detected, and a read and analysis circuit electrically connected to the detection circuit, said detection unit being fixed mechanically and thermally on a connection circuit, itself secured to the cold plane, said connection circuit conducting heat between said cold plane and the detection unit and being additionally intended to transfer the electrical signals output by the detection unit to the internal connection system of the cryostat, in particular at a connector intended in a known way to pass the electrical conductors out of the cryostat in leaktight fashion, wherein the cold plane is provided with at least one machined portion consisting of a recess extending between one of its peripheral edges toward the center of said cold plane in the region of a through-slot opening outside the cold finger when the cold plane is in place at the end of the latter; and said recess accommodates a relay connection element fixed by insertion and bonding into this recess, said connection element being electrically connectable to the connector of the cryostat by means of connection elements passing through said through-slot, said element being electrically connected to the connection circuit associated with the detection unit at the peripheral free end of said element.

In other words, the invention consists in providing a cold plane which is machined so as to accommodate an additional connection element, acting as a relay, one of the dimensions of this connecting element being variable, in order to make it possible to match said cold plane to any type of detection unit and consequently any type of detector. In fact, this connection element is simply insertable and held by bonding within the machined portion produced in the cold plane, so that it is possible to provide connection elements with different lengths depending on the actual dimensions of the detection unit or of the focal assembly.

Advantageously, these connection elements consist of ceramics including metallized conductive tracks extending parallel over their entire length, and therefore radially relative to the center of the cold plane.

BRIEF DESCRIPTION OF THE DRAWINGS

The way in which the invention can be embodied and the advantages which result therefrom will emerge better from the following exemplary embodiment, given by way of indication and without any implied limitation, with the aid of the appended figures.

DETAILED DESCRIPTION OF PREFERRED EMBODIMENTS

Figure 1:
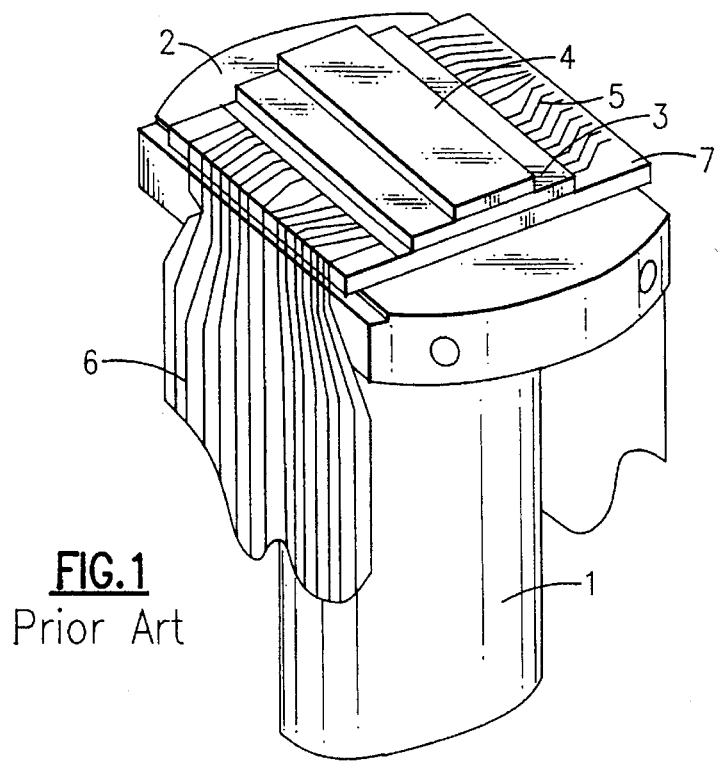
FIG. 1 is, as above, an infrared detection device according to the prior art.
Figure 4:
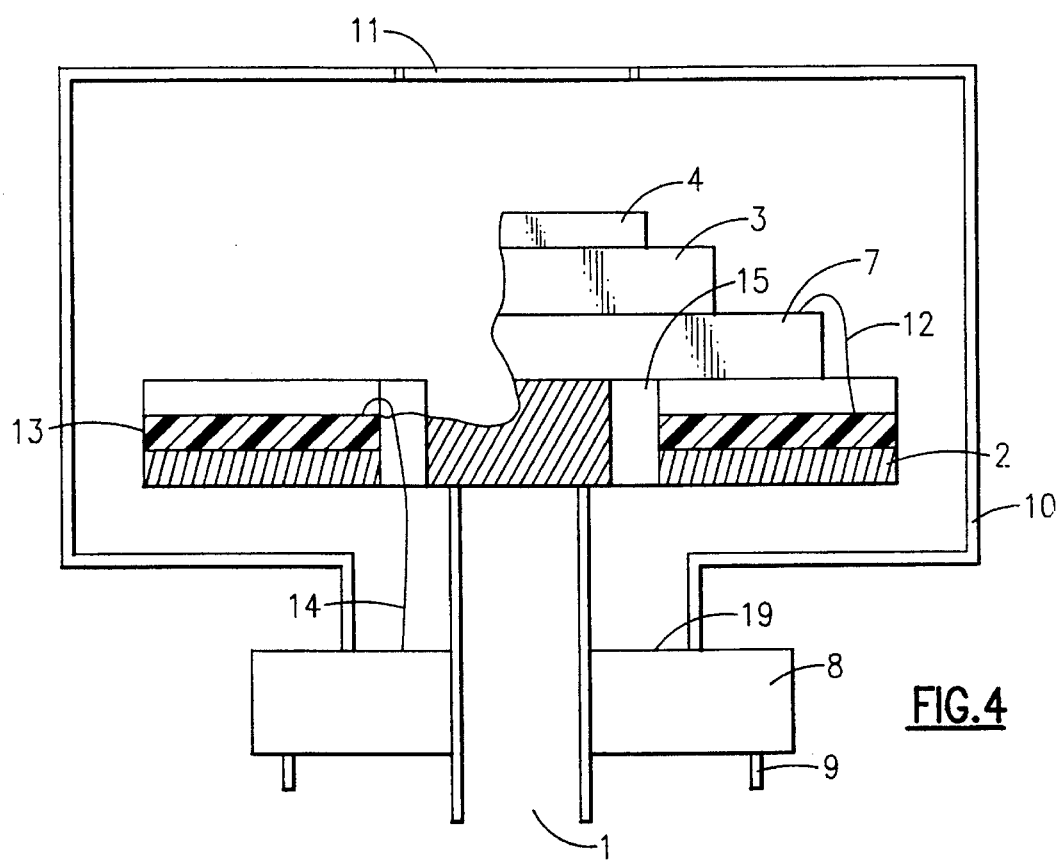
FIG. 4 is a schematic view in section along the line II—II in FIG. 2.
Figure 2:
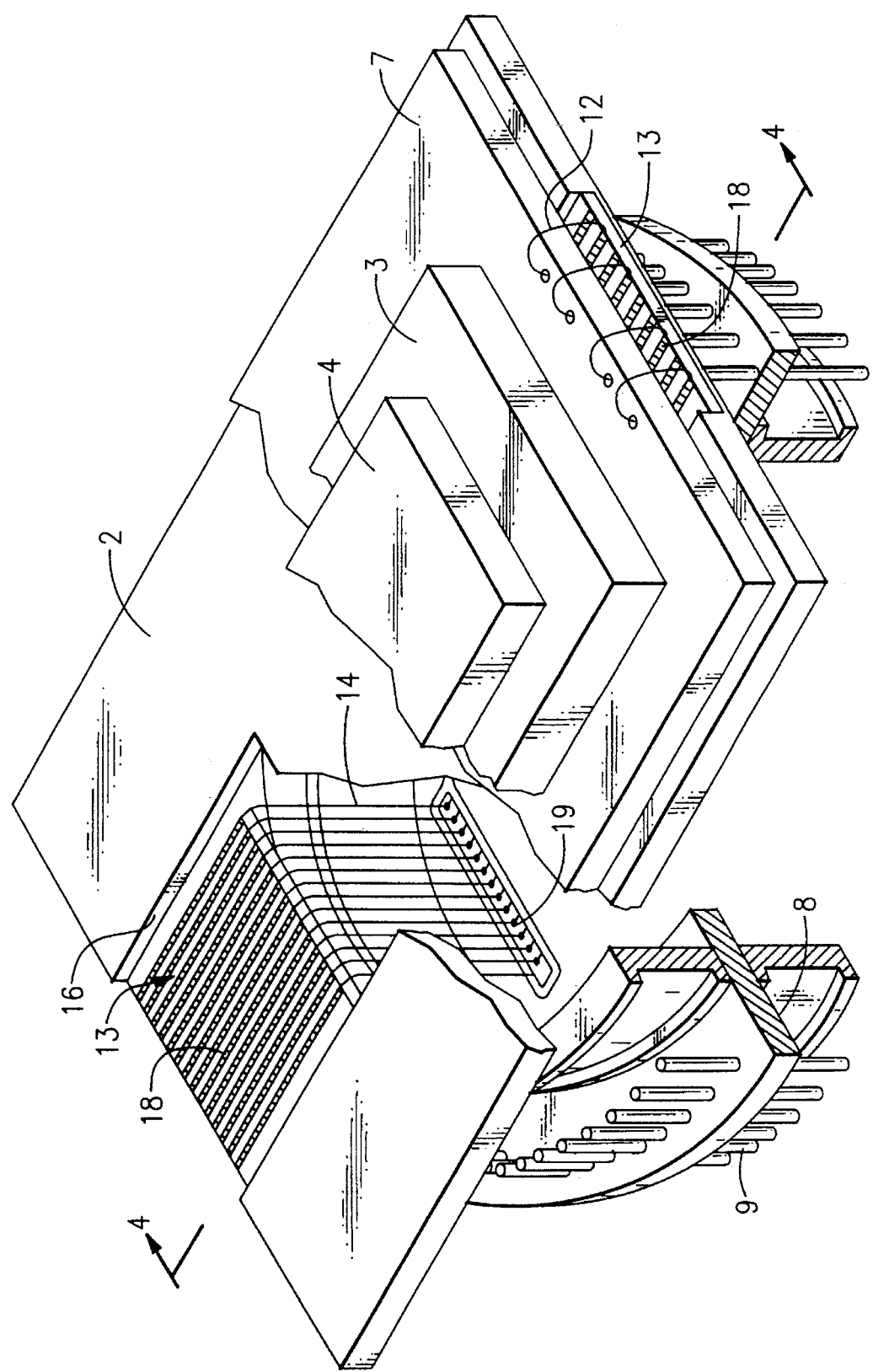
FIG. 2 is a schematic view in partial perspective of an infrared detection device according to the invention, equipped with a detection unit.
Figure 3:
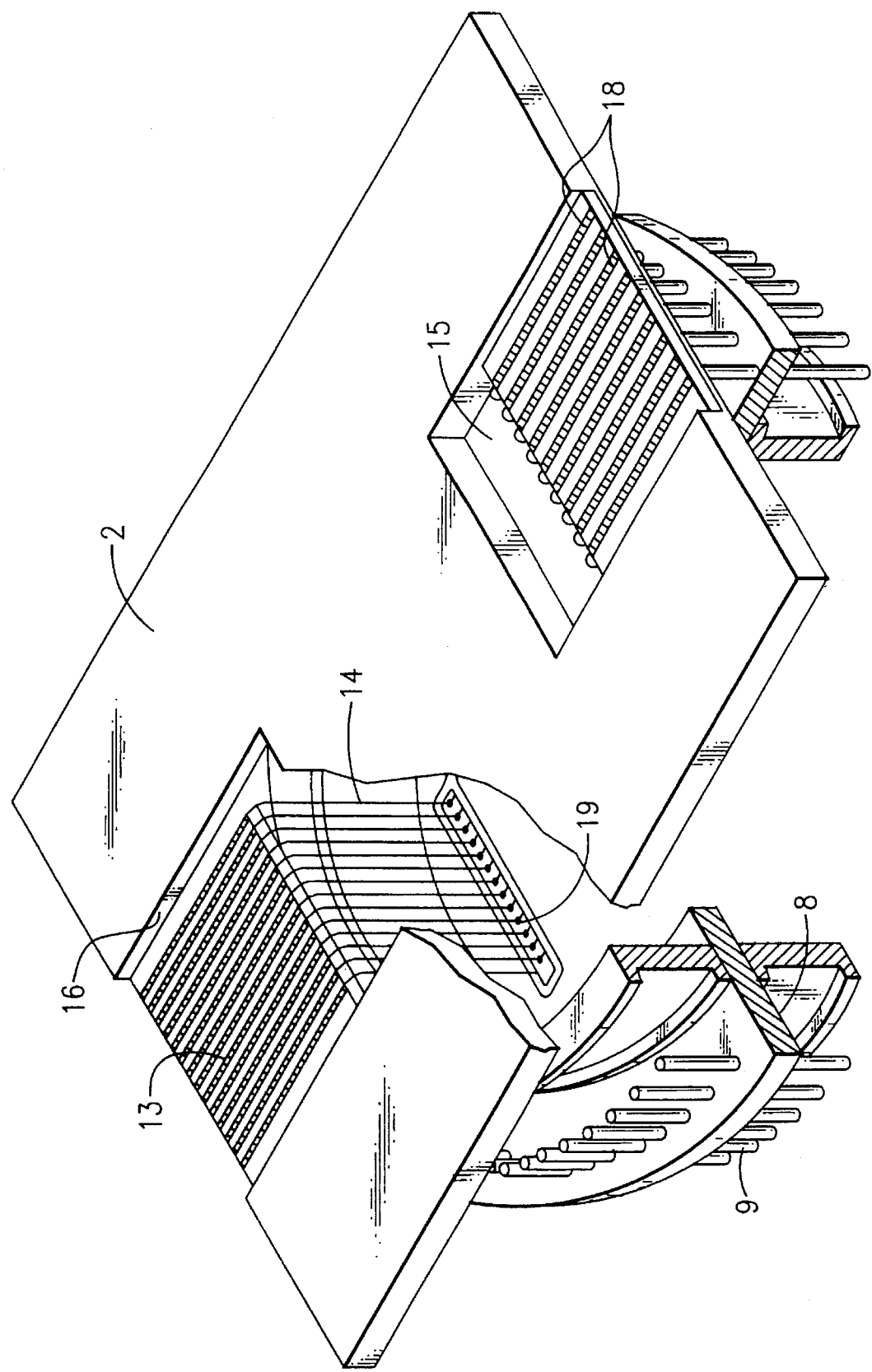
FIG. 3 is a figure similar to FIG. 2, but in which the detection unit has been removed in order to clarify the invention.

FIGS. 2, 3 and 4 represent the detection device according to the invention. This infrared detection device consists firstly of a cryostat with double coaxial cylindrical casing, namely the outer casing, generally used as a window support (10) and the inner casing consisting of the cold finger (1). The window is referenced (11) in FIG. 4. The cold finger (1) in direct contact with a cryogenic source is hermetically sealed, for example, by the cold plane (2) which typically consists of a ceramic plate fixed by bonding to the upper end of the cold finger and exchanging heat with the focal assembly which it accommodates on its upper face.

This focal assembly consists, on the one hand, of a detection circuit proper (4), typically consisting of linear arrays or matrices of photodiodes, connected by hybridization, in particular by means of indium microbumps, to the read circuit (3) which is itself fixed mechanically and thermally, in general by bonding, to a connection circuit (7). The latter is made of an insulating material and includes, on its upper surface, that is to say the surface intended to come into contact with the read circuit (3), metal tracks and contacts capable of providing the electrical conduction.

This connection circuit (7) is mechanically fixed to the cold plane (2) and is in heat exchange with the latter, fixing conventionally being carried out by bonding, for example epoxy bonding.

According to a fundamental feature of the invention, the cold plane (2) has at least one machined portion in the form of a recess and, in the example described, two recesses (16) which are represented symmetrically relative to each other in the embodiment used. Said recesses (16) each extend from two opposite edges of the cold plane toward the center of the latter, and each terminate at a through-slot (15), each of said slots (15) opening outside the cold finger 1), that is to say where the diameter is greater than that of the cold finger, as can also be seen in FIG. 4.

These recesses (16) are intended to accommodate relay connection elements (13) which can be inserted into said recesses and are mechanically fixed by bonding, for example epoxy bonding. These relay connection elements (13) also constitute a fundamental feature of the invention.

These relay connection elements (13) are made of an insulating material and, for example, ceramics including a plurality of metallized conductive tracks (18) extending over their entire length.

In view of the variable nature of the relay connection elements (13), it is possible, depending on the dimensions or the type of detector used, to adjust the cold plane itself, by inserting and bonding one or more connection elements (13) matched to these dimensions or to this type of detector.

These connection elements (13), which serve as conduction relays, are electrically connected to the connection circuit (7), in particular by ultrasonically welded gold microwires (12) of diameter 25 μm, this being done at their peripheral edge.

In addition, said connection elements (13) are also connected to the connector (8) by means of ultrasonically welded gold microwires (14), for example of diameter 25 μm, fixed to said connectors (13) at their internal edge, and being connected at a connector unit (19) while passing through the through-slots (15), said connector unit (19) being, in known fashion, either directly connected to the connector (8) and to its external pins (9) or incorporated in the latter.

In view of the fact that the relay connection elements (13) are inserted into the recesses (16) made in the cold plane (2), and also of the fact that the depth of the recesses (16) is greater than the thickness of the relay connection ceramics (13), the connection microwire loops (14) do not extend out of the bonding plane consisting of the interface between the cold plane (2) and the connection circuit (7), and for this reason do not hinder mounting of the focal assembly on the cold plane. Indeed, the upper plane of the relay ceramics (13) is lower than the upper plane of the cold plane (2).

In known fashion, the connector (8) includes regularly distributed connection pins (9), this making it possible to route the electrical signals output by the connector unit (19) to an analysis system external to the cryostat.

By virtue of the architecture thus described, it is no longer necessary to have only one connector template, and thus to regularize and standardize this template. There is in fact scope for variation within a wide range of dimensions of the ceramic relays (13) in order to match a cryostat/connector combination to a large number of detectors or focal assemblies.

In addition, the invention proves easy to implement, in view of the simplification of the connection system, thereby optimizing the reliability of the detection devices thus obtained.

Finally, the cost is also reduced by this, on the one hand in view of the standardization of the connector or of the cryostat/connector combination, and on the other hand in view of the consequent redundancy of the flexible lines, which prove expensive to use in view of the fact that they are difficult to employ, the fact that they are relatively fragile, making it necessary to replace them periodically, and also in view of the fact that the efficiency of the assembly is much lower with them.

I claim:

1. A device for the detection of infrared radiation, which operates at low temperature and comprises:

a cryostat equipped with a cold finger (1) intended to exchange heat with a cold source;

a cold plane (2) arranged generally perpendicularly relative to the cold finger (1) and mechanically fixed to and in heat exchange with the latter;

a detection unit comprising at least one detection circuit proper (4), sensitive to the infrared radiation to be detected, and a read and analysis circuit (3) electrically connected to the detection circuit (4), said detection unit being fixed mechanically and thermally on a connection circuit (7), itself secured to the cold plane, said connection circuit (7) conducting heat between said cold plane (2) and the detection unit (3, 4) and being additionally intended to transfer the electrical signals output by the detection unit (3, 4) to the internal connection system of the cryostat at a connector (8, 19) which passes the electrical conductors out of the cryostat in leaktight fashion, wherein the cold plane (2) is provided with at least one machined portion, each of said portions consisting of a recess (16) extending between one of its peripheral edges toward the center of said cold plane (2) in the region of a through-slot (15) opening outside the cold finger (1) when the cold plane (2) is in place at the end of the latter, and wherein each of said recesses (16) accommodates a first connection element (13) positioned by insertion into this recess and fixed by bonding, each of said first connection elements (13) being electrically connected to the connector (8, 19) of the cryostat by means of second connection elements (14) passing through said through-slot (15), said first connection element (13) being electrically connected to the connection circuit (7) at the peripheral free end of said first connection element (13).

2. The device for the detection of infrared radiation, as claimed in claim 1, wherein the first connection elements (13) consist of ceramics including metallized conductive tracks (18) extending parallel over their entire length, and therefore radially relative to the center of the cold plane.

3. The device for the detection of infrared radiation, as claimed in one of claims 1 and 2, wherein the depth of the recesses (16) is greater than the thickness of the first connection elements (13).

* * * * *